(12) United States Patent
Hoshino

(10) Patent No.: US 8,497,189 B1
(45) Date of Patent: Jul. 30, 2013

(54) PROCESSING METHOD FOR WAFER

(75) Inventor: Hitoshi Hoshino, Ota-Ku (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 13/541,191

(22) Filed: Jul. 3, 2012

(30) Foreign Application Priority Data

Jan. 24, 2012 (JP) .................................. 2012-11925

(51) Int. Cl.
*H01L 21/46* (2006.01)
(52) U.S. Cl.
USPC .............................. 438/463; 438/68; 438/464
(58) Field of Classification Search
USPC ..................... 438/458, 460, 462, 463, 464, 68
See application file for complete search history.

(56) References Cited

U.S. PATENT DOCUMENTS

| | | | |
|---|---|---|---|
| 6,887,650 B2 * | 5/2005 | Shimoda et al. | 438/464 |
| 7,655,541 B2 * | 2/2010 | Oba | 438/463 |
| 7,858,497 B2 * | 12/2010 | Nakamura | 438/462 |
| 7,915,140 B2 * | 3/2011 | Genda et al. | 438/462 |
| 2009/0280622 A1 * | 11/2009 | Genda et al. | 438/462 |
| 2010/0041211 A1 * | 2/2010 | Noda et al. | 438/464 |

FOREIGN PATENT DOCUMENTS

| | | |
|---|---|---|
| JP | 10-305420 | 11/1998 |
| JP | 2002-192370 | 7/2002 |
| JP | 2011-243875 | 12/2011 |

* cited by examiner

*Primary Examiner* — Kevin M Picardat
(74) *Attorney, Agent, or Firm* — Greer, Burns & Crain, Ltd.

(57) ABSTRACT

A wafer has, on a front face thereof, a device region in which a device is formed in regions partitioned by a plurality of scheduled division lines. An outer peripheral region surrounds the device region. A reflecting film of a predetermined width is formed from the outermost periphery of the wafer on a rear face of the wafer corresponding to the outer peripheral region. The front face side of the wafer is held in a chuck table, and a focal point of a pulsed laser beam of a wavelength having permeability through the wafer is positioned in the inside of the wafer corresponding to the scheduled division lines. The pulsed laser beam is irradiated from the rear face side of the wafer to form modified layers individually serving as a start point of division along the scheduled division lines in the inside of the wafer.

4 Claims, 9 Drawing Sheets

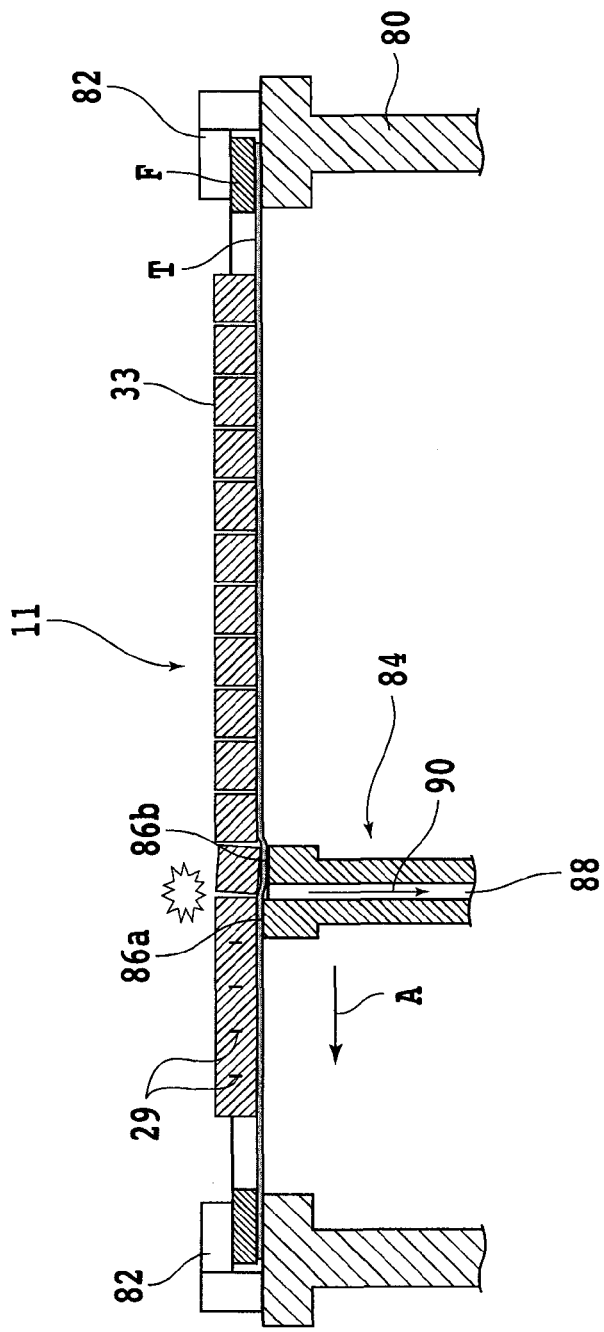

PROCESSING METHOD FOR WAFER

BACKGROUND OF THE INVENTION

1. Field of the Invention

This invention relates to a processing method for a wafer wherein a laser beam is irradiated upon a wafer such as an optical device wafer to form a modified layer in the inside of the wafer and then external force is applied to the wafer to divide the wafer into individual devices.

2. Description of the Related Art

An optical device wafer wherein a semiconductor layer (epitaxial layer) of gallium nitride (GaN) or the like is formed on a substrate for crystal growth such as a sapphire substrate or a SiC substrate and a plurality of optical devices such as LEDs are partitioned by streets (scheduled division lines) formed in a lattice shape and formed in the semiconductor layer, is comparatively high in Mohs hardness and difficult to divide by means of a cutting blade. Therefore, the optical device wafer is divided into individual optical devices by irradiation of a laser beam, and the divided optical devices are utilized in various electric apparatus such as portable telephone sets, lighting systems, liquid crystal television sets and personal computers.

As a method for dividing an optical device wafer into individual optical devices using a laser beam, first and second processing methods to be described below are known. The first processing method is a method wherein the focal point of a laser beam of a wavelength (for example, 1064 nm) having permeability through a substrate is positioned in the inside of a substrate corresponding to a scheduled division line. Then, the laser beam is irradiated along such scheduled division lines from the rear face side, on which no semiconductor layer is formed, to form a modified layer in the inside of the substrate. Thereafter, external force is applied to divide the optical device wafer into individual optical devices (refer to, for example, Japanese Patent No. 3408805).

The second processing method is a method wherein a laser beam of a wavelength (for example, 355 nm) having absorbability by a substrate is irradiated upon a region corresponding to scheduled division lines from the front face side to form dividing starting grooves which serve as start points of division by abrasion processing. Thereafter, external force is applied to divide the optical device wafer into individual optical devices (refer to, for example, Japanese Patent Laid-open No. Hei 10-305420). Any of the processing methods can divide an optical device wafer with certainty into individual optical devices.

Generally, on the rear face of an optical device such as an LED (Light Emitting Diode), a reflecting film is formed in order to enhance the extraction efficiency of light. This reflecting film is formed on the rear face of a wafer by sputtering, CVD (Chemical Vapor Deposition) or the like in a state of an optical device wafer. Where a reflecting film configured from gold, aluminum or the like is formed on the rear face of an optical device wafer in this manner, there is a problem that a laser beam cannot be irradiated from the rear face side of the optical device wafer. In order to solve this problem, a dividing method for a sapphire wafer wherein, before a reflecting film is formed on the rear face of a wafer, a laser beam is irradiated from the rear face side of the wafer to form a modified layer serving as a start point of division along a scheduled division line in the inside of the substrate is disclosed in Japanese Patent Laid-open No. 2011-243875.

SUMMARY OF THE INVENTION

However, the dividing method for a sapphire wafer just described has a problem in that, in the middle of a procedure wherein an optical device wafer in which a modified layer is formed is taken out from a laser processing apparatus and transported to a reflecting film forming apparatus for forming a reflecting film on the rear face of the optical device wafer or when such optical device wafer is taken out from the laser processing apparatus, the optical device wafer is sometimes broken.

Therefore, it is an object of the present invention to provide a processing method for a wafer wherein the wafer is not broken along a modified layer when the wafer is taken out from a laser processing apparatus and transported to a next stage and has a reflecting film on the rear face thereof.

In accordance with an aspect of the present invention, there is provided a processing method for a wafer which has, on a front face thereof, a device region in which a device is formed in each of regions partitioned by a plurality of scheduled division lines and an outer peripheral region which surrounds the device region, the processing method for a wafer including: a reflecting film forming step of forming a reflecting film of a predetermined width from the outermost periphery of the wafer on a rear face of the wafer corresponding to the outer peripheral region; a modified layer forming step of holding, after the reflecting film forming step is carried out, the front face side of the wafer by a chuck table, positioning a focal point of a pulsed laser beam of a wavelength having permeability through the wafer in the inside of the wafer corresponding to the scheduled division lines and irradiating the pulsed laser beam from the rear face side of the wafer to form modified layers individually serving as a start point of division along the scheduled division lines in the inside of the wafer; and a transporting step of taking out, after the modified layer forming step is carried out, the wafer from the chuck table and transporting the wafer to a next step.

Preferably, the wafer is an optical device wafer in which a semiconductor layer is laminated on a front face of a sapphire substrate and a plurality of optical devices are formed on the semiconductor layer such that the optical devices are partitioned by the scheduled division lines, and at the transporting step, the wafer is transported to a rear face processing step at which a reflecting film is laminated on the rear face of the wafer. Preferably, the processing method for a wafer further includes a dividing step of applying, after the modified layer forming step is carried out, external force to the scheduled division lines of the wafer to divide the wafer into the individual devices.

With the processing method for a wafer of the present invention, before a reflecting film is laminated over the overall area of the rear face of the wafer, when the focal point of the pulsed laser beam of the wavelength having permeability through the wafer is positioned in the inside of the wafer corresponding to the scheduled division lines and the pulsed laser beam is irradiated from the rear face side of the wafer to form modified layers in the inside of the wafer, since the reflecting film of the predetermined width is formed on the outermost periphery of the rear face of the wafer corresponding to the outer peripheral region, the modified layers are not formed in the outer peripheral region.

Accordingly, the outer peripheral region of the wafer serves as a reinforcing portion, and when the wafer is taken out from the chuck table and transported to the next step, the wafer is not broken along a modified layer. Further, even if the wafer has a reflecting film on the rear face thereof, the modified layers can be formed along the scheduled division lines.

The above and other objects, features and advantages of the present invention and the manner of realizing them will become more apparent, and the invention itself will best be understood, from a study of the following description and appended claims with reference to the attached drawings showing some preferred embodiments of the invention.

BRIEF DESCRIPTION OF THE DRAWINGS

FIG. 10 is a vertical sectional view illustrating a dividing step.

DETAILED DESCRIPTION OF THE PREFERRED EMBODIMENT

Figure 1:
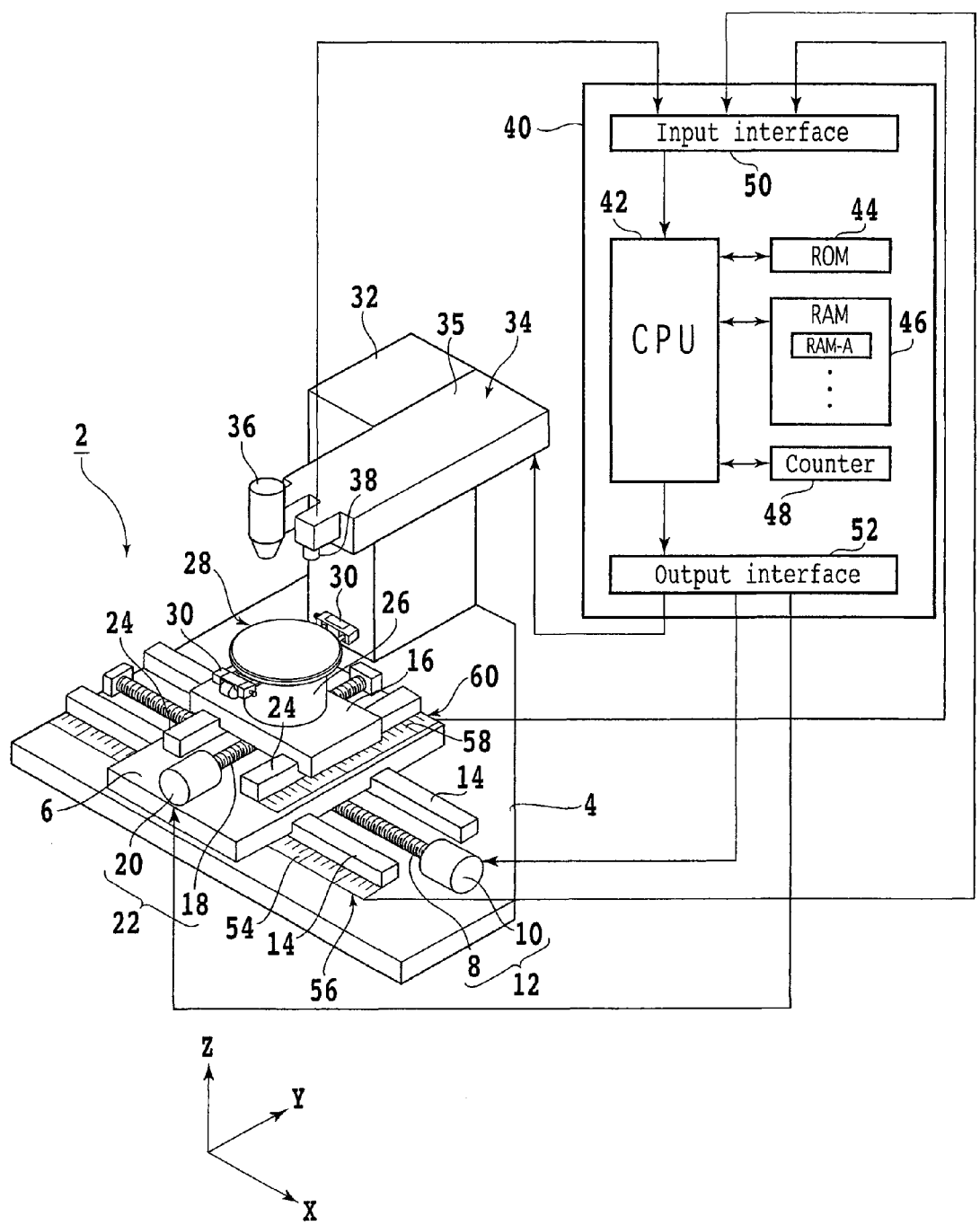
FIG. 1 is a perspective view of a laser processing apparatus.

In the following, an embodiment of the present invention is described in detail with reference to the drawings. FIG. 1 shows a schematic block diagram of a laser processing apparatus 2 suitable for carrying out a modified layer forming step in a wafer processing method of the present invention. The laser processing apparatus 2 includes a first slide block 6 mounted for movement in an X-axis direction on a stationary base 4. The first slide block 6 is moved in a processing feeding direction, that is, in the X-axis direction, along a pair of guide rails 14 by processing feeding means 12 configured from a ball screw 8 and a step motor 10.

A second slide block 16 is mounted for movement in a Y-axis direction on the first slide block 6. In particular, the second slide block 16 is moved in an indexing direction, that is, in the Y-axis direction, along a pair of guide rails 24 by indexing feeding means 22 configured from a ball screw 18 and a step motor 20. A chuck table 28 is mounted on the second slide block 16 with a cylindrical support member 26 interposed therebetween and can be moved in the X-axis direction and the Y axis direction by the processing feeding means 12 and the indexing feeding means 22, respectively. A clamp 30 for clamping an annular frame which supports a wafer sucked to and held by the chuck table 28 is provided on the chuck table 28.

Figure 2:
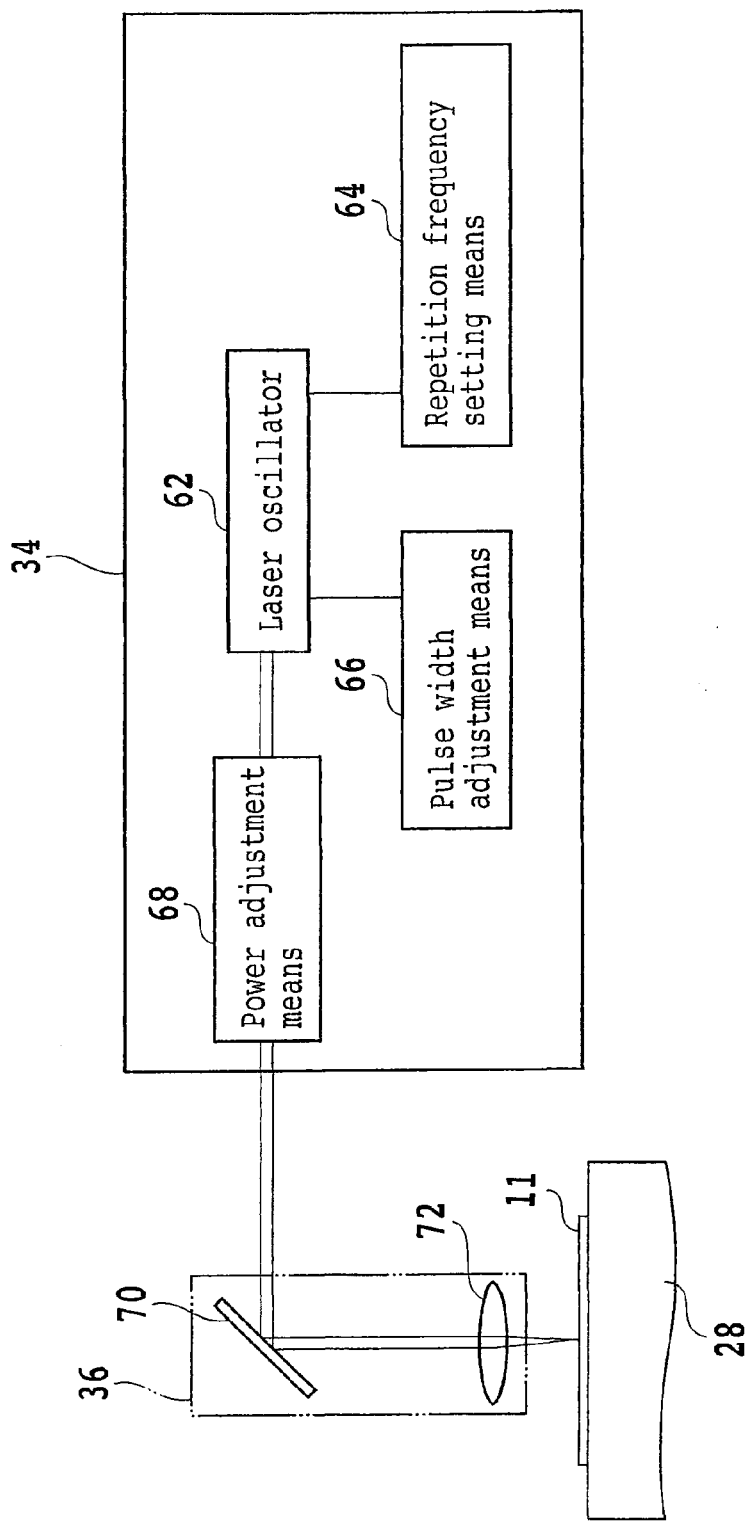
FIG. 2 is a block diagram of a laser beam generation unit.

A column 32 is provided uprightly on the stationary base 4, and a casing 35 for accommodating a laser beam generation unit 37 shown in FIG. 2 therein is attached to the column 32. Reference numeral 34 denotes a laser beam irradiation unit which is configured from the laser beam generation unit 37 shown in FIG. 2 and a condenser (laser head) 36 attached to an end of the casing 35.

As shown in FIG. 2, the laser beam generation unit 37 includes a laser oscillator 62 for oscillating YAG laser or YVO4 laser, repetition frequency setting means 64, pulse width adjustment means 66, and power adjustment means 68. A pulsed laser beam whose power is adjusted to predetermined power by the power adjustment means 68 of the laser beam generation unit 37 is reflected by a mirror 70 of the condenser 36 attached to the end of the casing 35, condensed by a condensing objective lens 72 and irradiated upon an optical device wafer 11 held on the chuck table 28.

At an end portion of the casing 35, image pickup means 38 for detecting a processing region to be laser processed is disposed in alignment with the condenser 36 in the X-axis direction. The image pickup means 38 includes an image pickup element such as an ordinary CCD element for picking up an image of the processing region of the optical device wafer 11 using visible light. The image pickup means 38 further includes infrared irradiation means for irradiating infrared rays on the optical device wafer 11, an optical system for catching infrared rays irradiated by the infrared irradiation means, and infrared image pickup means configured from an infrared image pickup element such as an infrared CCD element which outputs an electric signal corresponding to the infrared rays caught by the optical system. The image signal obtained by the image pickup is transmitted to a controller (control means) 40.

The controller 40 is configured from a computer and includes a central processing unit (CPU) 42 for carrying out an arithmetic operation process in accordance with a control program, a read only memory (ROM) 44 for storing the control program and so forth, a readable and writable random access memory (RAM) 46 for storing an arithmetic operation result and so forth, a counter 48, an input interface 50, and an output interface 52.

Reference numeral 56 denotes processing feed amount detection means configured from a linear scale 54 disposed along the guide rails 14, and a reading head not shown disposed on the first slide block 6. A detection signal of the processing feed amount detection means 56 is inputted to the input interface 50 of the controller 40. Reference numeral 60 denotes indexing feed amount detection means configured from a linear scale 58 disposed along the guide rails 24, and a reading head not shown disposed on the second slide block 16, and a detection signal of the indexing feed amount detection means 60 is inputted to the input interface 50 of the controller 40. Also an image signal obtained by image pickup by the image pickup means 38 is inputted to the input interface 50 of the controller 40. Meanwhile, from the output interface 52 of the controller 40, control signals are outputted to the step motor 10, step motor 20, laser beam generation unit 37 and so forth.

Figure 3:
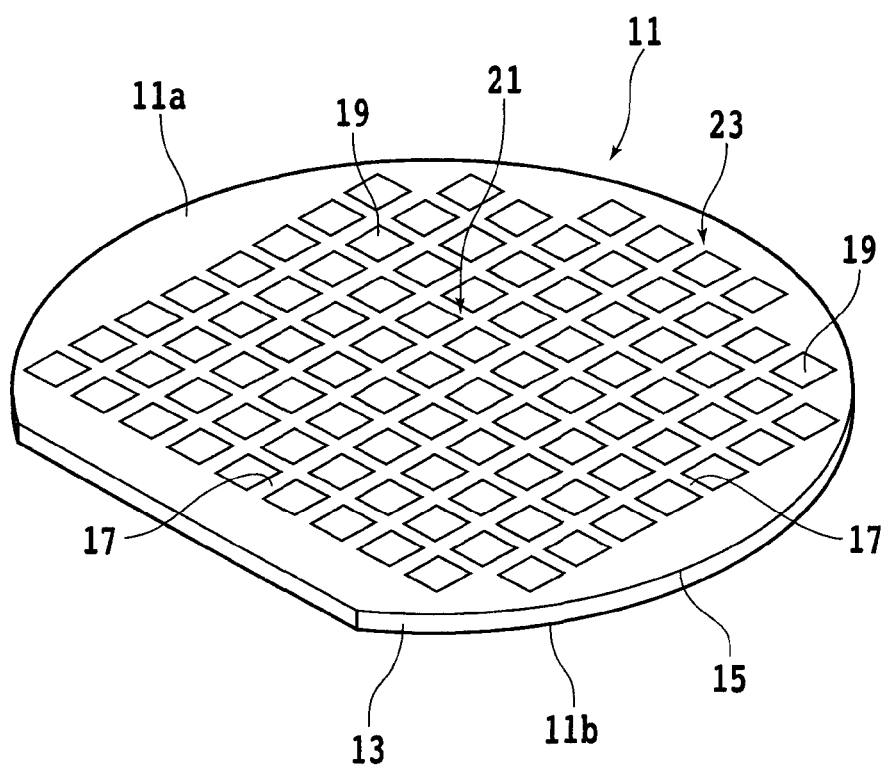
FIG. 3 is a perspective view of an optical device wafer.

Referring to FIG. 3, there is shown a surface side perspective view of the optical device wafer 11 used as a processing object of the processing method of the present invention. The optical device wafer 11 is configured by laminating an epitaxial layer (semiconductor layer) 15 of gallium nitride (GaN) or the like on a sapphire substrate 13. The optical device wafer 11 has a front face 11a on which the epitaxial layer 15 is laminated, and a rear face 11b to which the sapphire substrate 13 is exposed. The rear face 11b is formed as a mirror. The sapphire substrate 13 has a thickness of, for example, 120 μm, and the epitaxial layer 15 has a thickness of, for example, 5 μm. The epitaxial layer 15 has a plurality of optical devices 19 such as LEDs formed thereon and partitioned by scheduled division lines (streets) formed in a lattice pattern.

The optical device wafer 11 has, on the front face thereof, a device region 21 in which a plurality of optical devices 19 are formed and an outer peripheral region 23 which surrounds the device region 21. It is to be noted that the outer peripheral region 23 in the present embodiment is a region on the inner side by 0.2 to 2 mm with respect to an outermost periphery of the optical device wafer 11 and sometimes includes part of an outer periphery of the device region 21.

Figure 4A:
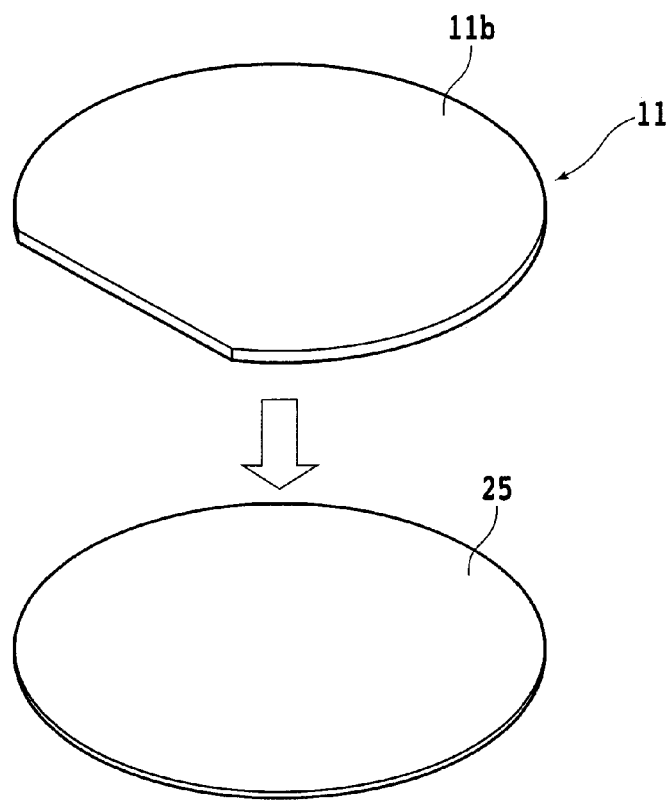
FIG. 4A is an exploded perspective view illustrating a manner in which a protective tape is adhered to a front face of the optical device wafer.
Figure 4B:
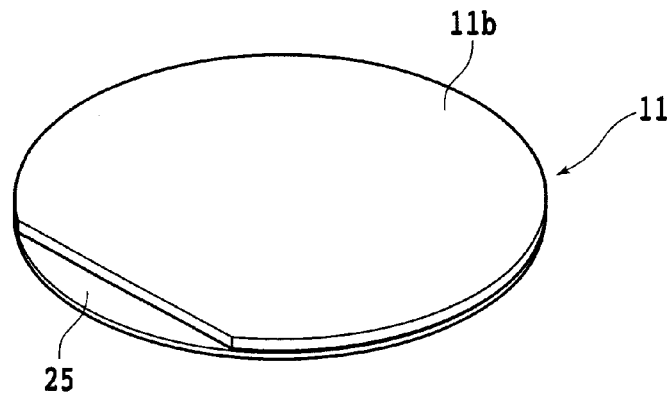
FIG. 4B is a perspective view of the rear face side of the optical device wafer having the protective tape adhered to the front face thereof.
Figure 5:
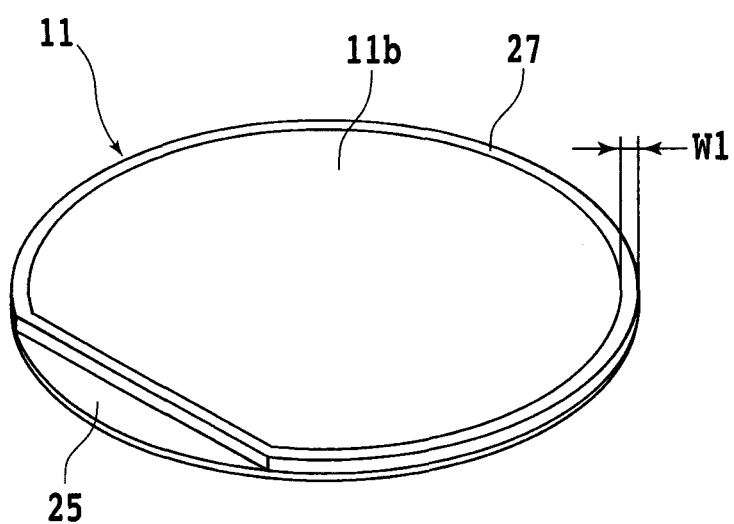
FIG. 5 is a perspective view of the rear face side of the optical device wafer which has a reflecting film of a predetermined width from an outermost periphery of the optical device wafer formed on the rear face of the optical device wafer by a reflecting film forming step.

In the processing method for a wafer of the present invention, in order to protect the optical devices 19 formed on the front face, a protective tape 25 is adhered to the front face 11a of the optical device wafer 11 as shown in FIGS. 4A and 4B. Then, a reflecting film forming step of forming a reflecting film 27 of a predetermined width W1 from the outermost periphery on the rear face 11b of the optical device wafer 11 corresponding to the outer peripheral region 23 as shown in FIG. 5 is carried out. At this reflecting film forming step, a mask equivalent to the optical device wafer 11 from which the predetermined width W1 from the outermost periphery is removed is placed on the rear face 11b of the optical device wafer 11 to form the reflecting film 27 of the predetermined width W1 from the outermost periphery by a sputtering method, a CVD method or the like. The predetermined width W1 is 0.2 to 2 mm and preferably is 1 to 2 mm.

After the reflecting film forming step is carried out, a modified layer forming step of forming a modified layer in the inside of the optical device wafer 11 is carried out. At this modified layer forming step, the optical device wafer 11 is sucked and held at the protective tape 25 side adhered to the front face thereof to and by the chuck table 28 of the laser processing apparatus 2, and the rear face 11b of the optical device wafer 11 is exposed. Then, alignment of picking up an image of the optical device wafer 11 from the rear face 11b side of the same by the infrared image pickup element of the image pickup means 38 to detect a region corresponding to a scheduled division line 17 is carried out. For this alignment, a well-known pattern matching method is utilized.

Figure 6:
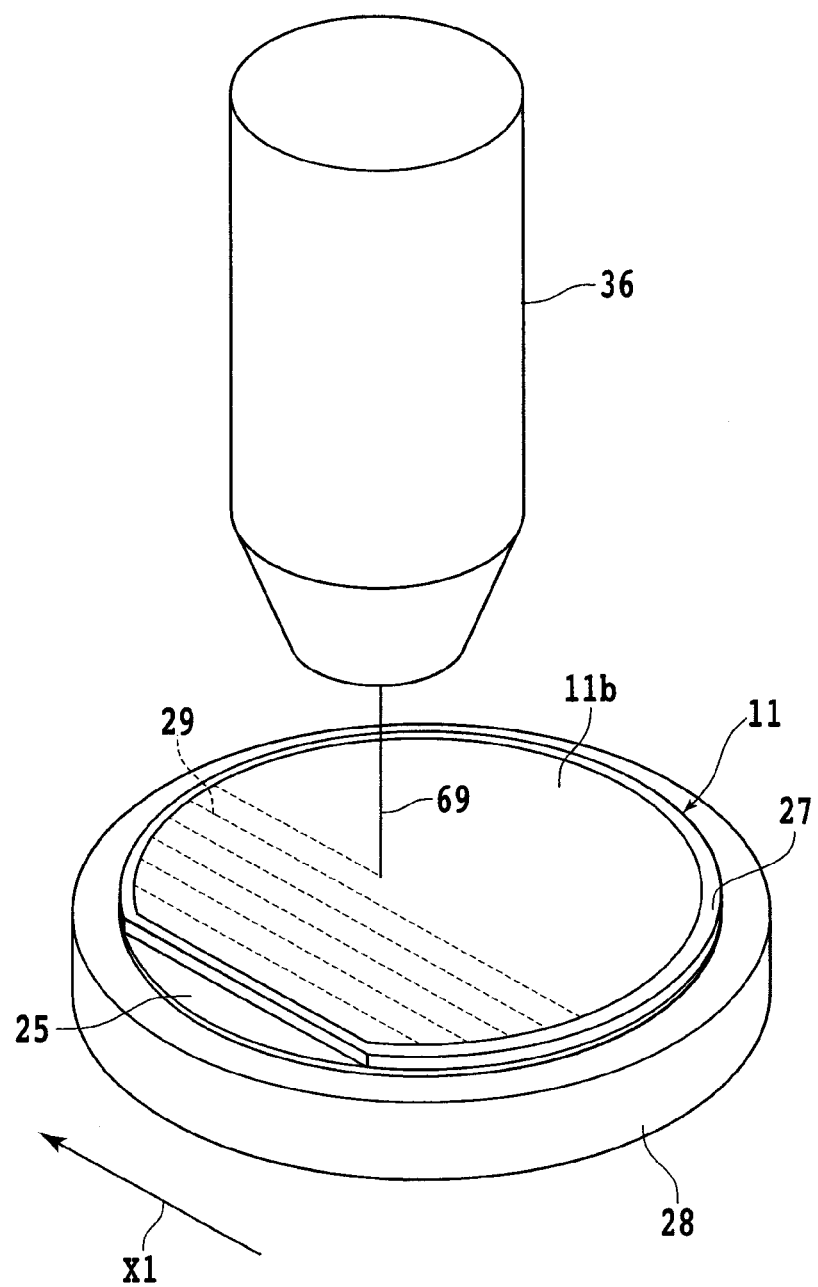
FIG. 6 is a perspective view illustrating a modified layer forming step.

At this modified layer forming step, as shown in FIG. 6, the focal point of a laser beam 69 having a wavelength having permeability through the sapphire substrate 13 from the rear face 11b side, formed as a mirror, of the optical device wafer 11 is positioned in the inside of the sapphire substrate 13 corresponding to a scheduled division line 17 by the condenser 36. Then, the laser beam 69 is irradiated along the scheduled division line 17 to form a modified layer 29 which is used as a start point of division in the inside of the sapphire substrate 13. Although the pulsed laser beam is irradiated also upon the outermost peripheral region of the optical device wafer 11 in which the reflecting film 27 is formed, since penetration of the laser beam 69 is prevented by the reflecting film 27, the modified layer 29 is not formed in the outermost peripheral region in which the reflecting film 27 is formed.

Figure 7:
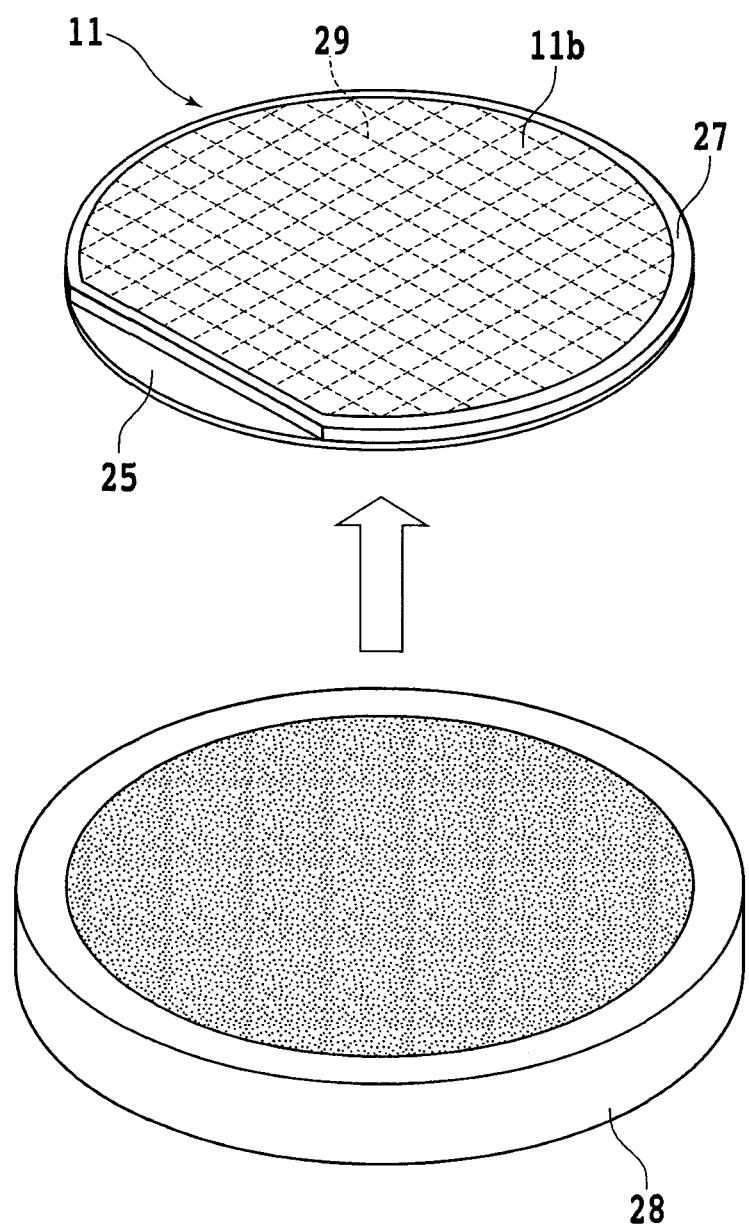
FIG. 7 is a perspective view illustrating a transporting step.

At this modified layer forming step, while the chuck table 28 is fed for processing in the direction indicated by an arrow mark X1, the modified layer 29 is formed along the scheduled division line 17 extending in the first direction. The modified layer 29 is formed in the inside of the sapphire substrate 13 along all scheduled division lines 17 of the optical device wafer 11 extending in the first direction while the chuck table 28 is successively fed for indexing. Then, the chuck table 28 is rotated by 90 degrees, and a similar modified layer 29 used as a start point of division is formed along all of the scheduled division lines 17 extending in the second direction crossing with the first direction. A rear face side perspective view of the optical device wafer 11 in a state in which a modified layer 29 serving as a start point of division is formed along all of the scheduled division lines 17 is shown in FIG. 7.

Processing conditions of the modified layer forming step are set, for example, in the following manner.

Light source: LD-pumped Q switch Nd: YAG
Wavelength: 1064 nm
Average output: 0.4 W
Repetition frequency: 100 kHz
Collected spot diameter: 1 μm
Pulse width: 100 ps
Working feed speed: 100 to 200 mm/second
Sapphire substrate: 120 μm thick
Position of focal point: 60 μm from rear face
Width of modified layer: 30 μm After the modified layer forming step is carried out, as shown in FIG. 7, a transporting step of cancelling the holding of the chuck table 28 by the suction, taking out the optical device wafer 11 from the chuck table 28 and transporting the optical device wafer 11 to a next step is carried out. Since the modified layer 29 is not formed in the outermost peripheral portion of the optical device wafer 11 in which the reflecting film 27 is formed, the outermost peripheral portion serves as a kind of reinforcing portion and prevents the optical device wafer 11 from being broken along a modified layer 29 during the transporting step of transporting the optical device wafer 11 to a next step.

Figure 8:
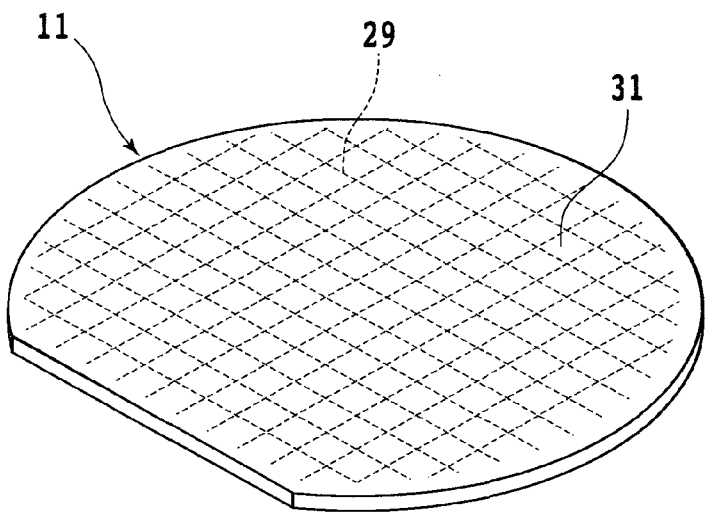
FIG. 8 is a perspective view of the rear face side of the optical device wafer which has a reflecting film on the overall rear face thereof formed by a rear face processing step.

In the wafer processing method of the present embodiment, the next step to which the optical device wafer 11 is transported at the transporting step is a rear face processing step (reflecting film forming step) of forming a reflecting film on the rear face 11b of the optical device wafer 11. Referring to FIG. 8, there is shown a rear face side perspective view of the optical device wafer 11 which has the modified layers 29 in the inside thereof and has a reflecting film 31 formed over the overall area of the rear face 11b. The reflecting film 31 is formed in an overlapping relationship also in the reflecting film 27. The reflecting film 31 is configured from gold, aluminum or the like and is formed by a well-known sputtering method, a well-known CVD method or the like.

Figure 9:
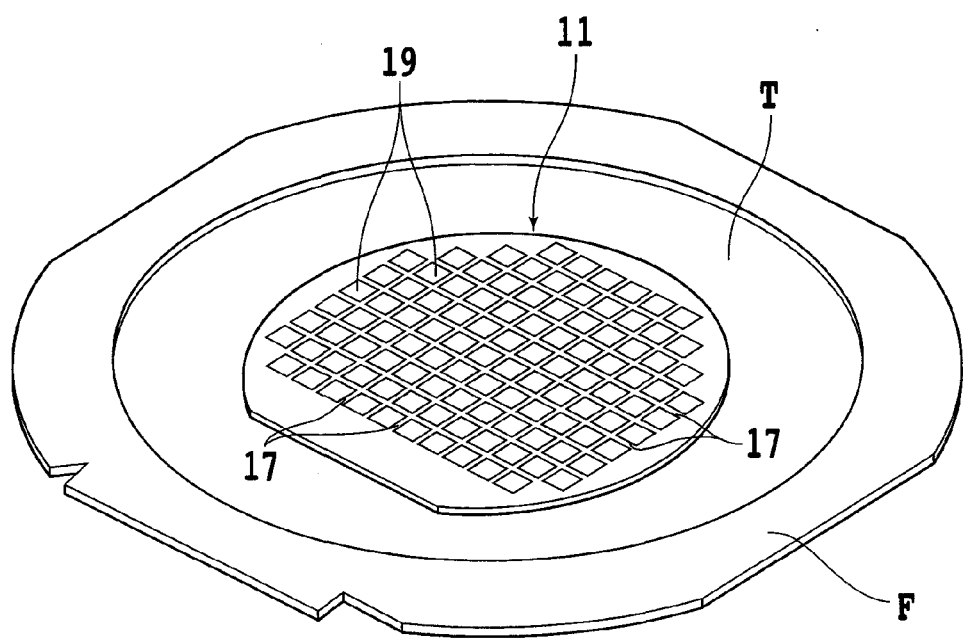
FIG. 9 is a perspective view of the optical device wafer supported on an annular frame through an adhesive tape.

After the rear face processing step is carried out, a dividing step of dividing the optical device wafer 11, in which the modified layers 29 are formed, into individual chips 33 each having an optical device 19 is carried out. As a preceding step to this dividing step, the optical device wafer 11 is adhered to an adhesive tape T which is adhered at an outer peripheral portion thereof to an annular frame F as seen in FIG. 9. Then, the annular frame F is placed on a receiving face of a cylinder 80 and clamped by a clamp 82 as shown in FIG. 10. Then, a dividing jig 84 in the form of a bar is disposed into the cylinder 80. The dividing jig 84 has an upper stage holding face 86a and a lower stage holding face 86b and has a vacuum suction path 88 formed therein which is open to the lower stage holding face 86b. A detailed structure of the dividing jig 84 is disclosed in Japanese Patent No. 4361506 and incorporated as a reference in the present specification.

In order to carry out the dividing step by the dividing jig 84, while the vacuum suction path 88 of the dividing jig 84 carries out vacuum suction as indicated by an arrow mark 90, the upper stage holding face 86a and the lower stage holding face 86b of the dividing jig 84 are brought into contact with the adhesive tape T from the lower side and the dividing jig 84 is moved in the direction indicated by an arrow mark A. In other words, the dividing jig 84 is moved in a direction perpendicular to the scheduled division line 17 along which division is to be carried out. If a modified layer 29 comes to a position just above an inner side edge of the upper stage holding face 86a of the dividing jig 84 as a result of the movement, then bending stress is generated in a concentrated manner at the position of the scheduled division line 17 which has the modified layer 29, and the optical device wafer 11 is cut along the scheduled division line 17 by the bending stress.

After the division along all of the scheduled division lines 17 extending in the first direction comes to an end, the dividing jig 84 is rotated by 90 degrees or the cylinder 80 is rotated by 90 degrees, and the scheduled division lines 17 extending in the second direction perpendicular to the scheduled division lines 17 extending in the first direction are cut similarly. Consequently, the optical device wafer 11 is divided into the individual chips 33.

Although the modified layer 29 is not formed in the inside of the sapphire substrate 13 corresponding to the reflecting film 27, since this portion has a very small width, the sapphire substrate 13 can be cut readily along extension lines of the scheduled division lines 17 which have the modified layers 29 by the dividing jig 84.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method for a wafer which has, on a front face thereof, a device region in which a device is formed in each of regions partitioned by a plurality of scheduled division lines and an outer peripheral region which surrounds the device region, the processing method comprising:
    a reflecting film forming step of forming a reflecting film of a predetermined width from the outermost periphery of the wafer on a rear face of the wafer corresponding to the outer peripheral region;
    a modified layer forming step of holding, after the reflecting film forming step is carried out, the front face side of the wafer by a chuck table, positioning a focal point of a pulsed laser beam of a wavelength having permeability through the wafer in the inside of the wafer corresponding to the scheduled division lines and irradiating the pulsed laser beam from the rear face side of the wafer to form modified layers individually serving as a start point of division along the scheduled division lines in the inside of the wafer; and
    a transporting step of taking out, after the modified layer forming step is carried out, the wafer from the chuck table and transporting the wafer to a next step.

2. The processing method for a wafer according to claim 1, wherein the wafer is an optical device wafer in which a semiconductor layer is laminated on a front face of a sapphire substrate and a plurality of optical devices are formed on the semiconductor layer such that the optical devices are partitioned by the scheduled division lines, and
    at the transporting step, the wafer is transported to a rear face processing step at which a reflecting film is laminated on the rear face of the wafer.

3. The processing method for a wafer according to claim 2, further comprising
    a rear face processing step of laminating the reflecting film over the overall area of the rear face of the wafer.

4. The processing method for a wafer according to claim 1, further comprising
    a dividing step of applying, after the modified layer forming step is carried out, external force to the scheduled division lines of the wafer to divide the wafer into the individual devices.

* * * * *